United States Patent
Miyazaki

(10) Patent No.: US 7,597,267 B2
(45) Date of Patent: Oct. 6, 2009

(54) IC CARD

(75) Inventor: Atsushi Miyazaki, Nagano-ken (JP)

(73) Assignee: Seiko Epson Corporation (JP)

( * ) Notice: Subject to any disclaimer, the term of this patent is extended or adjusted under 35 U.S.C. 154(b) by 584 days.

(21) Appl. No.: 11/235,312

(22) Filed: Sep. 27, 2005

(65) Prior Publication Data

US 2006/0097059 A1    May 11, 2006

(30) Foreign Application Priority Data

Nov. 8, 2004    (JP)    ............... 2004-323661

(51) Int. Cl.
*G06K 19/06*    (2006.01)
(52) U.S. Cl. ...................... 235/492; 235/487
(58) Field of Classification Search ................. 235/380, 235/492, 487, 493
See application file for complete search history.

(56) References Cited

U.S. PATENT DOCUMENTS 6,257,486 B1 * 7/2001 Teicher et al. ............... 235/380
6,816,058 B2 * 11/2004 McGregor et al. ......... 340/5.26

FOREIGN PATENT DOCUMENTS

| JP | 64-007570 | 1/1989 |
| JP | 01-128881 | 5/1989 |
| JP | 02-005195 | 1/1990 |
| JP | 05-212994 | 8/1993 |
| JP | 2001-338273 | 12/2001 |
| JP | 2003-270676 | 9/2003 |

* cited by examiner

*Primary Examiner*—Daniel A Hess
(74) *Attorney, Agent, or Firm*—Harness, Dickey & Pierce, P.L.C.

(57) ABSTRACT

An integrated circuit card including: a card body; an input means formed on the card body; and a function part that operates corresponding to the input of the input means; wherein, in the direction of the thickness of the card body, an uppermost part of the input means is located at the same height as that of a surface of the card body, or is located more inwardly than the surface of the card body.

8 Claims, 5 Drawing Sheets

IC CARD

RELATED APPLICATION INFORMATION

This application claims priority to Japanese Patent Application No. 2004-323661, filed Nov. 8, 2004, whose contents are expressly incorporated herein by reference.

BACKGROUND OF THE INVENTION

1. Technical Field

The present invention relates to an integrated circuits card (IC card) having an input means such as switches, etc.

2. Related Art

An IC card (smart card) has an integrated circuit (IC) chip embedded therein. Compared to magnetic stripe cards, IC cards are capable of providing a high information capacity, an improved security against forgery or unauthorized use, an ability to support diverse range of applications, and a reduced load for hosts (an ability of offline processing). Hence, IC cards have been applied in credit cards, cashing cards, and have started to be widely deployed in the fields of electric money, electric commerce, medical and health care, public transportation system, such as railways and busses, and building security system in entrance/exit controls. Further, in recent years, IC cards with switches, which allow the user to input specific information or select various applications, have been suggested. Such technologies are described, for instance, in Japanese Unexamined Patent Publication No. 2001-338273 and No. 2003-270676.

IC cards, which have advantages of having prominent convenience and portability, on the other hand, are easy to be lost because of user's incaution. Therefore, it is common that users place IC cards in a pocket or a card case when not in use, and carry them along.

However, IC cards provided with switches involved the problem of false operation, caused because the switch is pressed unintentionally by the user during the carriage of the IC cards, or by unexpected contact to the switch.

SUMMARY

The advantage of the invention is to provide an IC card that can suppress the false operation of the switch thereof.

Based on the above situation, the inventor has come up with the present invention with means mentioned hereafter.

According to an aspect of the invention, an IC card includes: a card body; an input means formed on the card body; and a function part that operates corresponding to the input of the input means; wherein, in the direction of the thickness of the card body, an uppermost part of the input means is located at the same height as that of a surface of the card body, or is located more inwardly than the surface of the card body.

With such structure, the uppermost part of the input means is located at the same level of the surface of the IC card, or at the pitted plain lower than the surface level of the IC card. Consequently, the input into the input means is conducted only in the case where the pressure is applied onto the input means in the direction of the card body's thickness. Moreover, since the pressure is less likely to be brought on the direction of thickness, the input into the input means is less facilitated in the case where the pressure is applied onto the input means in approximately the horizontal direction of, or at an angle with, the card body's surface. Therefore, the function part can be activated, only if the user pushes in the input means locally to the direction of the card body's thickness, with the user's own judgment to activate the function part. Further, the function part can be deactivated, if the pressure is applied to the input means, in approximately the horizontal direction of, or at an angle with, the card body's surface. Consequently, incorrect input to the input means can be prevented, except for the case where the function part is activated by the user's judgment; therefore the false operation of the IC card can be prevented.

In this case, in the IC card in the invention, a first component on which the input means and the function part are formed, and a second component arranged at the side where the input means in the first component is formed, may be adhered together.

This way, the card body has an adhered structure including the first component and the second component; thereby an IC card with an eminent strength can be implemented.

It is desirable that, in the IC card, the second component include a cover portion that shields the input means and the function part; and a height from the surface of the first component to the uppermost part of the function part, and a height from the surface of the first component to the uppermost part of the input means, be the same.

This way, the input means and the function part, both of which are formed on the first component, can together be protected by the cover portion. Further, the strength of the card body can be improved by forming the second component.

Still further, with the input means being shielded by the cover portion, it is possible to provide the input means more inwardly than the surface of the IC card. Consequently, the function part is activated only in the case where the input means is pushed in locally in the direction of the card body's thickness. Moreover, the function part can be deactivated, if the pressure is applied to the input means in approximately the horizontal direction of, or at an angle with, the card body's surface. Consequently, the incorrect input to the input means can be prevented, except for the case where the function part is activated by the user's judgment; therefore the false operation of the IC card can be prevented.

In the IC card, it is also desirable that the second component include the cover portion that shields only the input means, and an opening that exposes the function part; and that the height, from the surface of the first component to the uppermost part of the input means, be lower than the height from the surface of the first component to the uppermost part of the function part.

This way, the input means formed on the first component can be protected by the cover portion. Still further, with the input means being shielded by the cover part, it is possible to provide the input means to the input means more inwardly than the surface of the IC card. Consequently, the function part is activated only in the case where the input means is pushed in locally in the direction of the card body's thickness. Moreover, the function part can be deactivated, if the pressure is applied to the input means in approximately the horizontal direction of, or at an angle with, the card body's surface. Therefore, the incorrect input to the input means can be prevented, except for the case where the function part is activated by the user's judgment; hence the false operation of the IC card can be prevented.

Since the function part is exposed at the opening, if the function part serves as an external connecting terminal, the external device can be connected through this exposed external connecting terminal. If the function part serves as a display part, the exposed display part can display an image.

In contrast to the above, if the cover portion shields the display part in the case where the function part serves as the display part, the displayed image transmitted through the cover portion has a degraded display property caused by the refractive index of the material of the cover portion, causing the image to be represented in a recessed manner. In the above aspect of the invention, the display part is exposed through the opening; hence, when compared to the case where the display part is covered by the cover portion, a clear image with a high contrast can be displayed.

It is desirable that, in the IC card, the card body further include a third component arranged to face the second component; and the first component be supported by the second component and the third component.

As described, since the first component is supported by the second and the third components, the input means and the function part, both of which are formed on the first component, can be protected. Moreover, the IC card with a robust adhered structure can be implemented.

In this case, the integrated circuit card in the invention may include the function part serves as a display part that allows an image display.

This way, the display part can display the image in accordance with the input of the input means.

Here, it is desirable that the display part be an Electrophoretic Display (EPD) device. The Electrophoretic Display (EPD) device is a display component provided with image display retention or display memory characteristics. Hence, after a driving component, such as thin-film transistor (TFT) or the like, applies the prescribed voltage over given period of time, the image can be retained without further applying the voltage. Consequently, since power consumption for displaying images can be reduced, an IC card with low power consumption as well as with display memory characteristics can be materialized.

In this case, the IC card in the invention may include the function part that serves as an external connection terminal that allows a connection with an external device.

This way, a communication can be conducted between the IC card and the external device via the external connecting terminal, in accordance with the input of the input means.

In this case, the IC card in the invention may include the function part that serves as a fingerprint sensor that extracts fingerprint information.

By including the fingerprint sensor, it is possible to authenticate the user of the IC card, and to restrict the user. Therefore, the ill usage of the IC card can be prevented. In other words, the IC card with security system can be materialized.

BRIEF DESCRIPTION OF THE DRAWINGS

The invention will be described with reference to the accompanying drawings, wherein like numbers refer to like elements, and wherein.

DESCRIPTION OF THE EMBODIMENTS

Hereafter, the embodiments of the IC card in the invention will now be described.

The embodiments merely represent some of the embodiments for the present invention, and shall not limit the invention. The invention allows any modification as far as it falls within the main technical scope of the invention. Figures shown hereafter have different scale size for each of the layers and components, so that each of them will have a size large enough to be recognized in the figures.

Embodiment 1 of the IC Card

Embodiment 1 of the IC card in the invention is described with reference to the drawings.

Figure 1:
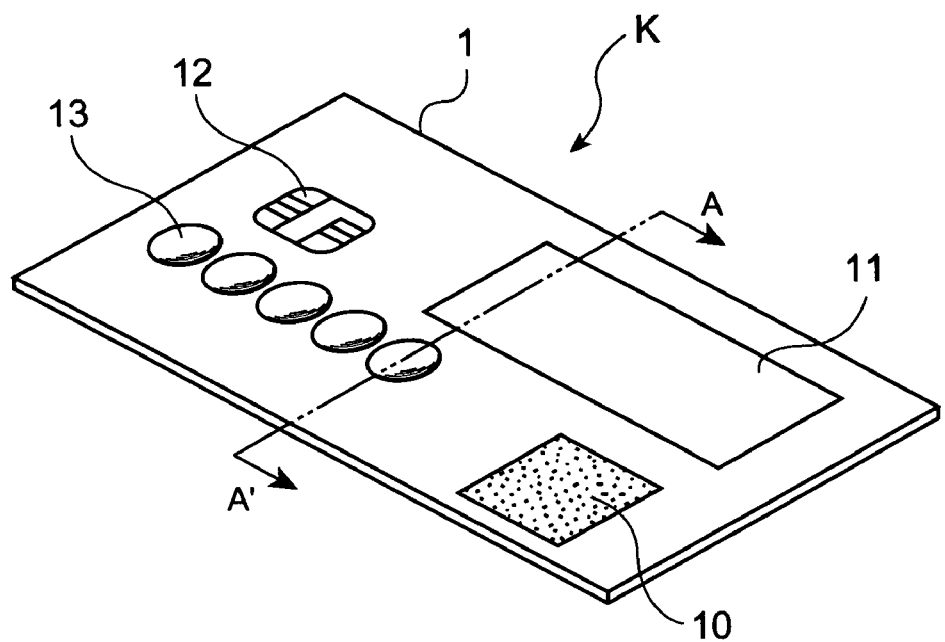
FIG. 1 is an oblique drawing showing an IC card in Embodiment 1.
Figure 2:
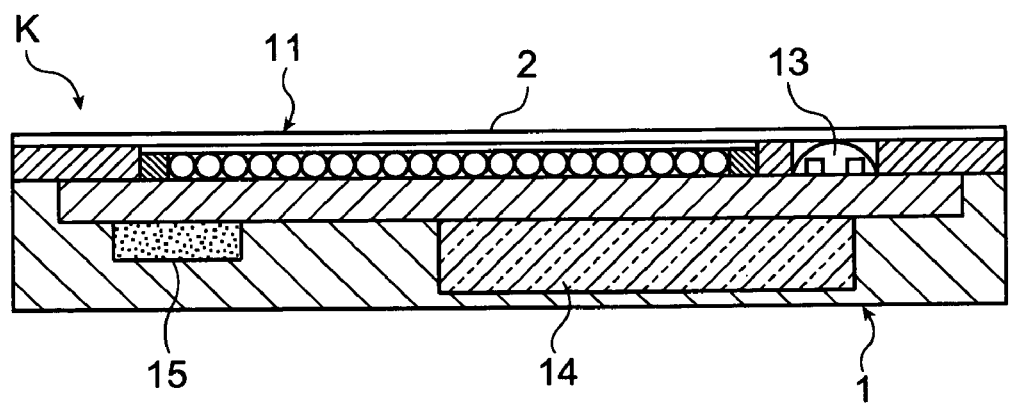
FIG. 2 is a sectional magnified drawing showing the IC card in Embodiment 1.
Figure 3:
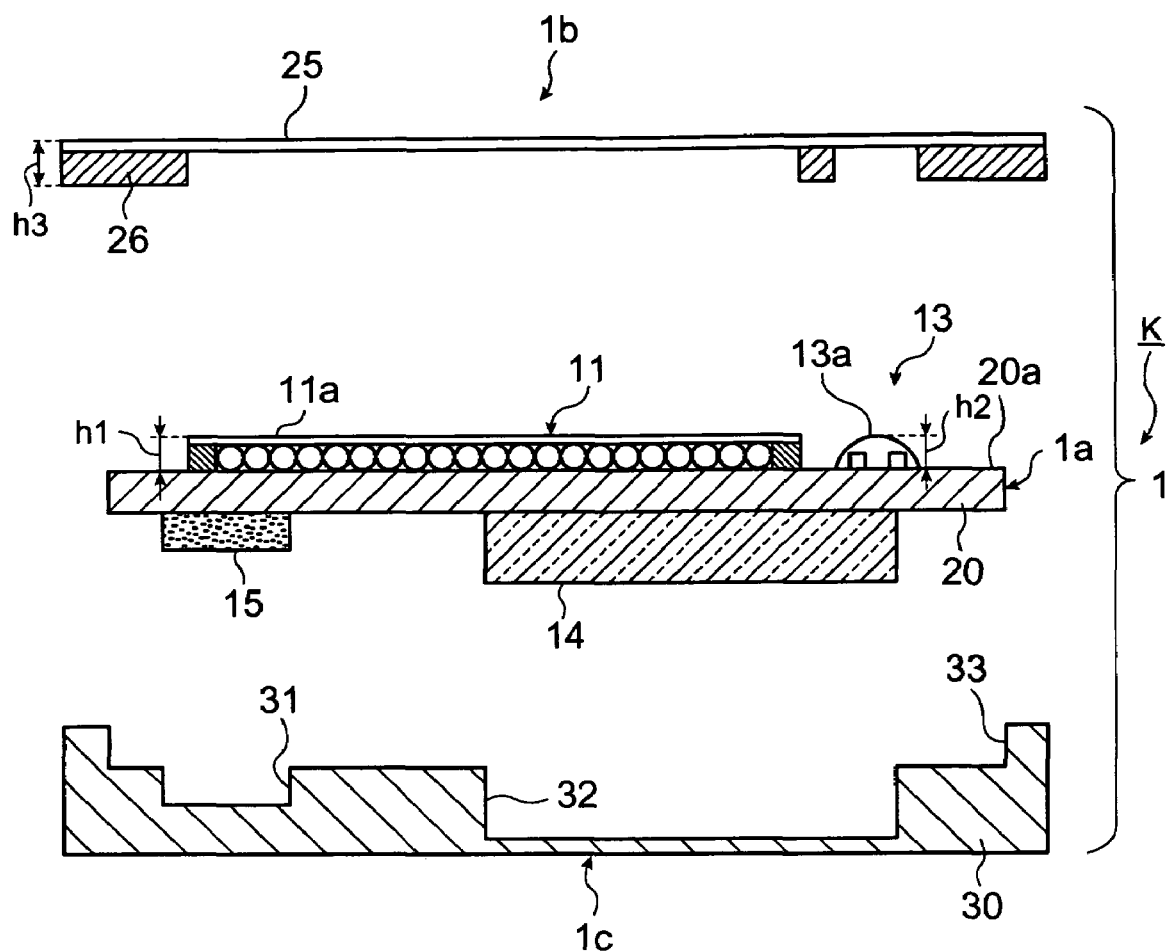
FIG. 3 is a deal drawing showing the IC card in Embodiment 1.

FIG. 1 is an oblique drawing showing an IC card K in the embodiment. FIG. 2 is a drawing showing a section A-A' in FIG. 1, which is a sectional magnified drawing describing the sectional structure of the IC card K. FIG. 3 is a sectional magnified drawing of the IC card K, which is a deal drawing describing the structure of the IC card K in detail.

As shown in FIG. 1, the IC card K includes a card body 1, a fingerprint sensor 10 (a part of the function part), an Electrophoretic Display (hereafter EPD) 11 (a part of the function part and the display part), which is part of both the function part and the display part, a connecting IC terminal 12 (a part of the function part), and a membrane switch 13 (a part of the input means). Further, the card body 1 includes a polymer battery 14 and an IC chip 15 therein, as shown in FIGS. 2 and 3. Still further, the card body 1 is composed with an inlet 1a (a part of the first component), a front panel 1b (a part of the second component), and a back panel 1c (a part of the third component), where the inlet 1a is supported by the front panel 1b and the back panel 1c.

Here, the inlet 1a has a Flexible Print Circuit (hereafter FPC) 20 as a substrate material, and is provided with the fingerprint sensor 10, the EPD 11, the external connecting terminal 12, and the membrane switch 13, all on the side facing the front panel 1b. The inlet 1a is also provided with the polymer battery 14 and the IC chip 15, both on the side facing the back panel 1c. The FPC 20 is a circuit substrate composed with a plastic film that has excellent size stability, such as polyethylene terephthalate (PET), polyethylene naphthalate (PEN), and polyimide, etc. Such plastic film has a flexibility, and can be bent or folded freely, allowing a three-dimensional wiring, a circuit connection to curved portions, or the like. A height h1 represents the distance between a top surface 20a of the FPC 20 and an uppermost part 11a of the EPD 11, and a height h2 represents the distance between the top surface 20a of the FPC 20 and an uppermost part 13a of the membrane switch 13. The relations between the heights h1 and h2 are h1=h2. In other words, they both have the same height.

The front panel 1b is provided with a cover portion 25 and a junction 26. The cover portion 25 is composed with transparent and flexible resin material, such as acrylic resin etc., shielding the membrane switch 13 and the EPD 11. The cover portion 25 has a thickness that is thin enough to retain its flexibility. For instance, if the user presses the membrane switch 13 in, the cover portion located immediately above bends sufficiently. It is preferable that the cover portion 25 have fine transparency, since the display image of the EPD 11 is transmitted through it. The junction 26 is a component where it is adhered with the inlet 1a and the back panel 1c. The height h3 of the junction 26 is the same as that of the h1 of the EPD 11. This way, there will be no gap between the junction 26 and the FPC 20, when the inlet 1a and the front panel 1b are adhered together and the EPD 11 and the cover portion 25 touch each other.

The back panel 1c includes a flexible resin substrate 30, on which a plurality of concavo-convex portions 31, 32, 33, are formed. Each of the concavo-convex portions 31, 32, 33, is formed corresponding to the shape of the polymer battery 14, the IC chip 15, and the FPC 20, respectively. They interlock when the back panel 1c and the inlet 1a are adhered together.

The inlet 1a, the front panel 1b, and the back panel 1c mentioned above are adhered together with adhesives applied between them. Hence the IC card K shown in FIG. 2 is constructed. In the card body 1 adhered and constructed this way, the uppermost part 13a of the membrane switch 13 is located more inwardly than the surface 2 of the card body 1. The IC card K has an eminent strength from the adhered structure made by the inlet 1a, the front panel 1b, and the back panel 1c.

Hereafter, the fingerprint sensor 10 and the EPD 11, both of which are formed on the inlet 1a, is described in detail with reference to FIGS. 4 through 6.

(Fingerprint Sensor)

Figure 4:
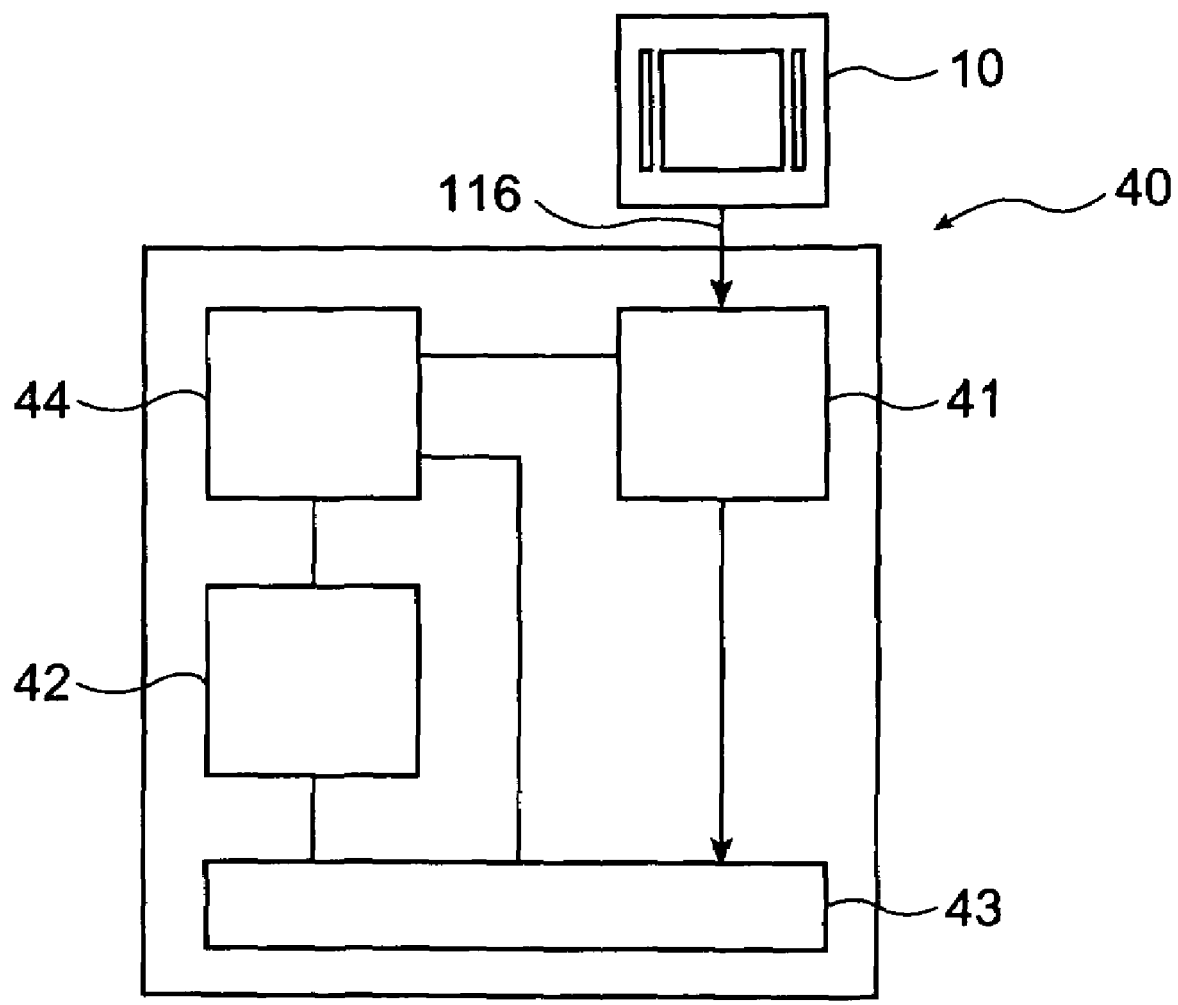
FIG. 4 is a block diagram showing the processing part that processes information input from the fingerprint sensor.
Figure 5:
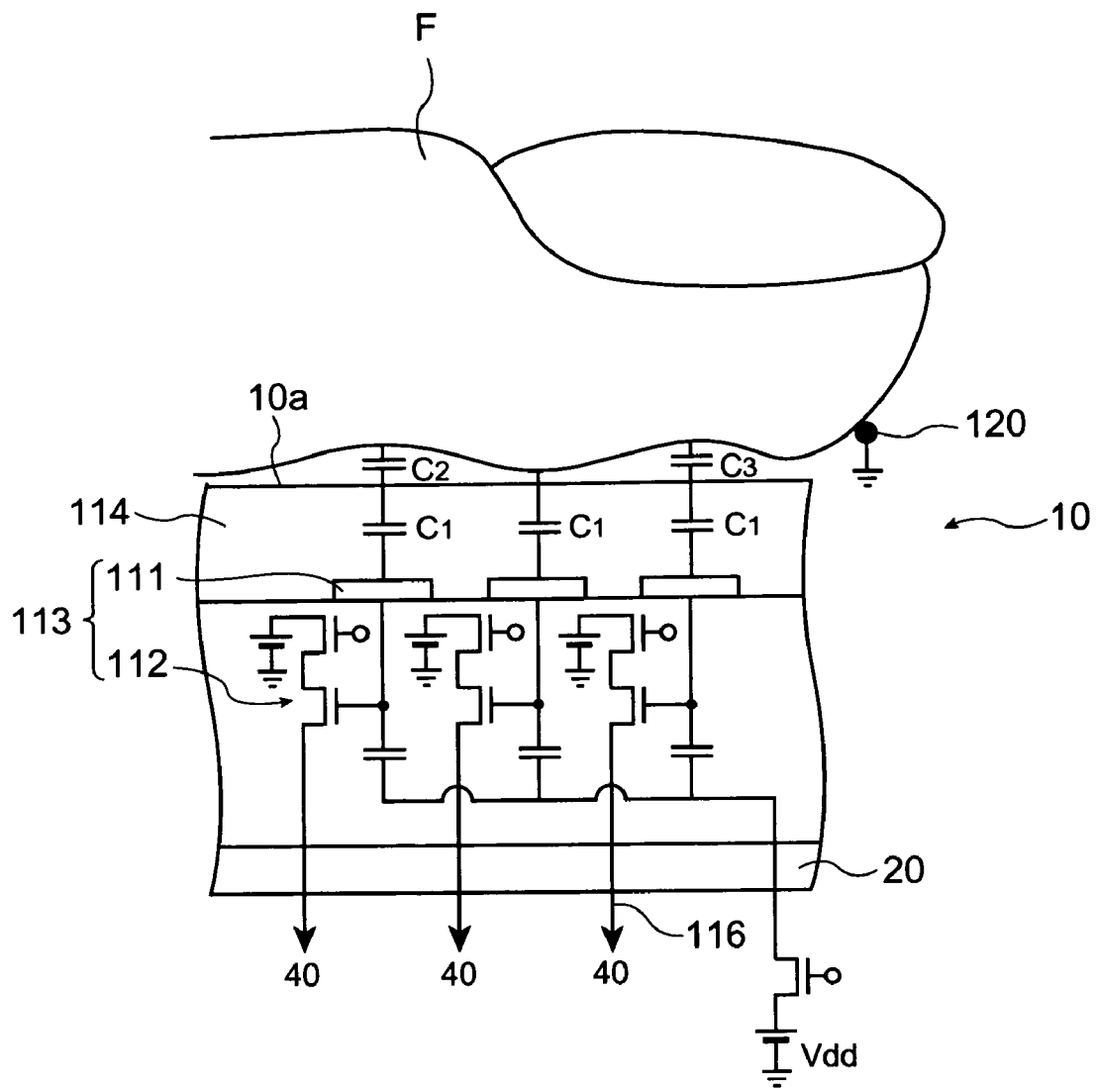
FIG. 5 is a schematic drawing showing a configuration of the fingerprint sensor.

FIG. 4 is a block diagram describing a processing part 40 that processes information input from the fingerprint sensor 10, and FIG. 5 is a schematic drawing showing a configuration of the fingerprint sensor 10.

As shown in FIG. 4, the processing part 40 includes a data processing part 41 that conducts the feature extraction of fingerprint patterns incorporated into the fingerprint sensor 10, a memory 42 that stores various pieces of information of a feature value that hold a specific fingerprint pattern, a comparing part 43 that compares a feature value extracted from the data processing part 41 to the feature value stored in the memory 42, and a control part 44 that controls the operation of the IC card K. The IC chip 15 conducts such processing in the processing part 40 described above.

As shown in FIG. 5, the fingerprint sensor 10 detects the fingerprint pattern by measuring capacitance, where ridges and valleys of the fingerprint surface result in the changes of capacitance patterns, corresponding to the variations of distance between the fingerprint surface and the detecting surface 10a. Such static capacitive fingerprint sensor 10 does not require a light source, thereby allows a thinner sensor, and enables the improvement of the dent-resistance by appropriately selecting a surface-protection layer (passivation film).

The fingerprint sensor 10 is formed on the FPC 20 with remove-and-transfer technique (described later). The FPC 20 is provided thereon with: a plurality of scanning lines (not shown) formed in parallel to each other in prescribed intervals; and a plurality of signal lines 116, crossing the scanning lines at right angles, formed in parallel to each other with prescribed intervals.

At each of the corresponding locations where the plurality of scanning lines and the signal lines 116 intercept, membrane-switching component 112 (detecting circuit) provided with transistors etc., is installed. The scanning lines, the signal lines 116 and the membrane-switching components 112 compose an active matrix array 113. Over it, each detecting electrode 111 is installed on each of the locations corresponding to the membrane-switching components 112, in the shape of matrix. Each detecting electrode 111 is covered with an dielectric film (passivation film) so that the entire surface of the active matrix array 113 is covered. The dielectric film 114 allows a contact with a finger F of the user of the IC card K.

The materials for the active matrix array 113 include a MOS transistor array formed on the semiconductor substrate, a thin-film transistor (TFT) formed on the isolation substrate, or the like.

In the fingerprint sensor 10 with such configuration, patterns of static capacitance, which are distributed in two-dimensions, are created between the finger F and each of the detecting electrodes 111 arranged in matrix, if the finger F touches the detecting surface 10a (refer to C1, C2, and C3 in FIG. 5). The active matrix array 113 electrically reads out the values of static capacitance patterns spread in two-dimension. Thereby it is possible to detect patterns of fine asperity on the surface of the finger F, in other words, fingerprint patterns, to be extracted. Such fingerprint sensor 10 that uses the static capacitance method is susceptible to electrostatic discharges from the human body. In order to avoid such breakdown caused by the discharge, it is essential to discharge the electrostatic charges in the finger F and to perform grounding, prior to the detection, so that the electric potential of the finger F becomes approximately the same potential as that of the ground G level (reference potential) of the membrane-switching component 112. Additionally, in order to achieve a stable detection of each value of the static capacitance, it is preferable to fix the electric potential of the finger F to a prescribed electric potential at the time of the detection. For this reason, an electrode different from the detecting electrodes 111, in other words, a discharging electrode 120 that discharges the electrostatic charges in the human body is installed at any region on the IC card K.

In the embodiment, a static capacitive fingerprint sensor 10 is employed. However, other types of fingerprint sensors can also be employed. For instance, any among resistive, electro-optic, piezoelectric, and the static capacitive sensors can be employed. The static capacitive sensor is particularly suitable. This is because: such sensor detects the fingerprint patterns by detecting the capacitance patterns, which changes corresponding to the variations of distance between the detecting surface and the patterned indented fingerprint surface; does not require a light source; and easily allows itself to be made thinner.

As described, by including the fingerprint sensor 11 into the IC card K, it is possible to authenticate the user thereof, as well as to restrict the user. Therefore, the ill usage of the IC card can be prevented. Consequently, the IC card K with security system can be materialized.

(EPD)

Figure 6:
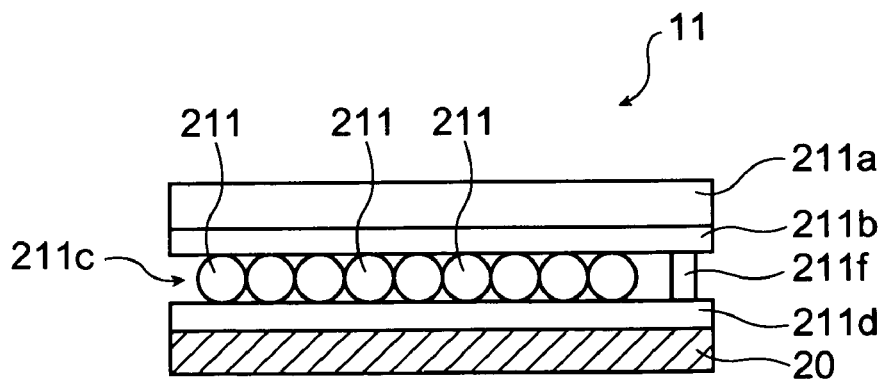
FIG. 6 is a sectional drawing showing a section of an Electrophoretic Display (EPD)

FIG. 6 is a sectional drawing showing a section of the EPD 11.

The EPD 11 is an Electrophoretic Display device utilizing the electrophoretic migration.

As shown in FIG. 6, the EPD 11 has a structure, in which an electrode film 211d, an electrophoretic display layer 211c, an electrode film 211b, and a surface protection layer 211a that protects this display portion, are deposited on the flexible FPC 20. The surface protection layer 211a can be omitted. The electrode film 211b is provided with a plastic film that has excellent size stability, such as polyethylene terephthalate (PET), polyethylene naphthalate (PEN), polyimide, etc., on which an electrode is formed. The electrode film 211d is also formed with an electrode whose substrate is using a similar material from the above, while the transparency is not necessarily required. Electrical continuity is provided to the electrode film 211b and the electrode film 211d by a top-to-bottom conducting electrode 211f. The electrode film 211b serves as a common electrode, in which the same electric potential is applied across the entire film surface, while the electrode film 211d serves as a driving electrode, on which active matrix electrodes or segment electrodes are formed.

The microcapsules 211 that form the electrophoretic display layer 211c have encapsulated shells, the materials thereof including: a composite membrane of gum Arabic and gelatin, urethane resin, urea resin, carbamide resin. The methods for producing the encapsulated shells may include common microcapsulation method, such as: interfacial polymerization, in-situ polymerization, phase segregation, interfacial precipitation, spray-drying, etc. Within the capsules, migrating particles and disperse medium are filled in. As for the migrating particles, organic or inorganic particles (polymer or choroids) are used. For instance, one or more kinds of pigments may be used among: black pigments, such as aniline black, carbon black, etc.; white pigments, such as titanium dioxide, zinc oxide, antimony trioxide, etc.; yellow pigments, such as isoindolinone, yellow zinc, yellow iron oxide, cadmium yellow, titanium yellow, antimony, etc.; azo system pigments, such as monoazo, disazo, polyazo, etc.; red pigments, such as quinacridone red, chromium vermilion, etc.; blue pigments, such as phthalocyanine blue, indanthrene blue, anthraquinone dye, iron blue, ultramarine blue, cobalt blue, etc.; and green pigments, such as phthalocyanine green, etc. Materials for disperse medium may include medium in which a surface-active agent is compounded into mixed or single material among: colorless or pigmented water colored by a dye; disperse medium of alcohol system, such as methanol, ethanol, isopropanol, butanol, octanol, and methyl cellusolve, etc.; various kinds of ester group, such as ethyl acetate, butyl acetate, etc.; ketone group, such as acetone, methyl ethyl ketone, methyl isobutyl ketone, etc.; aliphatic hydrocarbon, such as pentane, hexane, octane, etc.; alicyclic hydrocarbon, such as cyclohexane, methylcyclohexane, etc.; aromatic hydrocarbon having long-chain alkyl base, such as benzene group etc., including benzene, toluene, xylene, hexylbenzene, butylbenzene, octyl benzene, nonylbenzene, decylbenzene, undecylbenzene, dodecylbenzene, tridecylbenzene, tetradecylbenzene, etc.; hydrocarbon halide, such as methylene chloride, chloroform, carbon tetrachloride, 1,2-dichloroethane, etc.; carboxylate, or other various oil groups.

In the electrophoretic migration, electrophoretic particles are charged to positive or negative in advance, and the electrophoretic particles and the dispersive medium are colored in different colors. For instance, let's assume that the white particles made of titanium oxide are charged to positive, and the black particles made of carbon black are charged to negative. Here, if an electric field is applied to the two electrode films 211b and 211d, so that the electrode film 211b becomes negative and the electrode film 211d becomes positive, then the charged white particles are pulled toward the electrode film 211b, and the black particles are pulled toward the electrode film 211d. Thus, considering that the electrode film 211b is a transparent electrode, looking from the above of the electrode film 211b, such parts where the white particles are pulled thereto are displayed in white. Contrary, if the electrode film 211b becomes positive and the electrode film 211d becomes negative, then the charged white particles are pulled toward the electrode film 211d, and the black particles are pulled toward the electrode film 211b. Thus, looking from the above of the electrode film 211b, such parts where the black particles are pulled thereto are displayed in black.

Since the EPD 11 has a large number of microcapsules 211 described above, controlling the electric field of each address electrode in the electrode films 211b and 211d allows a display of a desired character, number or symbol in black and white pixels.

With the microcapsules 211 being driven by an active matrix driving method, the electrode film 211d undergoes patterning, in which each pixel is patterned into pixel electrode. The electrode film 211d is also provided with thin-film transistors, signal electrodes, and scanning electrodes (none shown). Here, the electrode film 211b is set as a transparent common electrode formed evenly on an optical transparent substrate. In this case, being a common electrode, the electric potential on the entire electrode film 211b is evenly the same (for example, zero). Hence, by controlling the electric field of each address electrode at the electrode film 211d, in other words, by applying a positive or a negative electric potential, the particles within the microcapsules 211 at the location of the electrode are moved based on the principal described above, thereby allowing a display of the desired image. Similarly, if the electrode film 211d is set as the common electrode, the particles within the microcapsules 211 at the location of the electrode are moved by controlling the electric field of each address electrode at the electrode film 211b, thereby allowing a display of the desired image.

In the case of a time division driving, the electrode films 211b, 211d are constructed with the transparent electrode, composed with line-shaped transparent conductors that intercross at right angles, such as Indium Tin Oxide, etc. The microcapsules 211 are arranged at the regions where both electrodes intersect.

The methods for driving are not limited to the aforementioned ones. According to the application, the optimal method should be selected. Further, various sizes can be employed for the diameters of microcapsules 211.

Since the above-described EPD 11 is a display component provided with image display retention or display memory characteristics, the application of the prescribed voltage over given period of time by the driving component, such as TFT or the like, to the EPD 11 allows the retention of the image without further application of the voltage. Consequently, since the power consumption for displaying images can be reduced, an IC card K with low power consumption as well as with display memory characteristics can be materialized.

In the aforementioned fingerprint sensor 10 and EPD 11, the thin-film transistors are utilized in order to electrically read-out the fingerprint information as the static capacitance, and the voltage is applied to the electrophoretic display layer 211c. Such thin-film transistors are formed on the FTP 20 by a remove-and-transfer technique such as SUFTLA (Surface Free Technology by Laser Ablation, a registered trademark) or the like. More specifically, low-temperature polysilicon thin-film transistors are formed preliminarily on a heat-resistant and transparent substrate (such as a glass substrate for instance). Thereafter, prescribed thin-film transistors are stripped by laser ablation, followed by the transfer of the thin-film transistors onto the FPC 20. By means of such technique, thin-film transistors, which have only been able to be formed on a hard, heat resistant substrate such as a glass substrate, until such technology was available, can be formed on a flexible substrate, which has inferior heat-resistance than that of, for instance, the glass substrate, by the transfer. Therefore, the thin-film transistor can easily be formed on the flexible FPC 20 etc., thereby enabling an implementation of the IC card K with flexibility, while being provided with the fingerprint sensor 10 and the EPD 11.

The connecting IC terminal 12 is connected to a terminal installed in the external device, at the time of information transmission between the IC card K and the external device (not shown). Moreover, the connecting IC terminal 12 is connected to the IC chip installed inside the IC card K, transmitting the input/output signal between the external device and the IC chip.

The membrane switch 13 is formed at a portion located at the same level of the surface of the IC card K, or at the pitted plain lower than the surface level of the IC card K. The selection and confirmation of the available application is performed with the IC card K. The plural numbers of applications are displayed on the aforementioned EPD 11. The applications displayed on the EPD 11 are selected and confirmed using the membrane switch 13. The membrane switch 13 do not only select and confirm the applications, but also functions as a power switch for switching the power of the IC card K from OFF (power off status) to ON (power on status).

The polymer battery 14 is a rechargeable secondary battery, in which a electrolyte of the lithium-ion battery is improved into a polymer. Such lithium-polymer battery has advantages such as to allow a reduction in size and weight, and to provide flexion tolerance, since a conductive polymer can be utilized instead of a liquid electrolyte; thereby both electrodes can be configured in film-formed layers. Furthermore, it is known that an energy density of the polymer battery is relatively high, which is approximately 1.5 times as much as that of the lithium-ion battery in the same cubage. The lithium-polymer battery does not utilize liquid electrolyte, unlike a NiCd battery, a NiMH battery, or a lithium-ion battery, which are common as conventional secondary batteries. Hence, the packaging of batteries and the shape thereof are not restricted, which enables a light-weighted device.

The IC chip 15 includes an arithmetic circuit such as Central Processing Unit (CPU) etc., a driving circuit such as drivers etc., and a storage circuit provided with ROM, RAM or the like. Such IC chip 15 is formed on the FPC 20 with the aforementioned remove-and-transfer technique, and conducts: controls of display operation of EPD 11 and the fingerprint sensor 10; processing of input signal from the membrane switch 13; and a communication with the external device to which the information is input/output via the connecting IC terminal 12.

As mentioned above, in the IC card K in the embodiment, the uppermost part 13a of the membrane switch 13 is located more inwardly than the surface of the card body 1. In other words, the uppermost part 13a is located at the pitted plain lower than the surface level of the IC card K. Therefore, the input to the membrane switch 13 can be conducted only in the case where the pressure is applied onto the membrane switch 13 in the direction of the card body 1's thickness. Moreover, the input into the membrane switch 13 is less facilitated in the case where the pressure is applied onto the membrane switch 13, in approximately the horizontal direction of, or at an angle with, the card body 1's surface, since the pressure is less likely to be brought on the direction of thickness. Therefore, the EPD 11 can be activated, only if the user pushes in the membrane switch 13 locally in the direction of the card body 1's thickness, with the user's own judgment to activate the EPD 11. Further, the EPD 11 can be deactivated, if the pressure is applied to the membrane switch 13 in approximately the horizontal direction of, or at an angle with, the card body 1's surface. Consequently, the incorrect input to the membrane switch 13 can be prevented, except for the case where the EPD 11 is activated by the user's judgment; therefore the false operation of the IC card K can be prevented.

The front panel 1b is provided with the cover portion that shields the membrane switch 13 and the EPD 11, thereby protecting them. Further, since the inlet 1a is supported by the front panel 1b and the back panel 1c, the IC card with a robust adhered structure can be implemented.

Still further, since the cover portion shields the membrane switch 13, it is possible to provide the membrane switch 13 more inwardly than the surface of the IC card. Consequently, the EPD 11 is activated only in the case where the membrane switch 13 is pushed in locally in the direction of the card body 1's thickness.

Embodiment 2 of the IC Card

Embodiment 2 of the IC card in the invention is described with reference to the drawings.

In Embodiment 2, the same signs and numerals are used for the same structure as in the aforementioned Embodiment 1, and the descriptions thereof are simplified.

Figure 7:
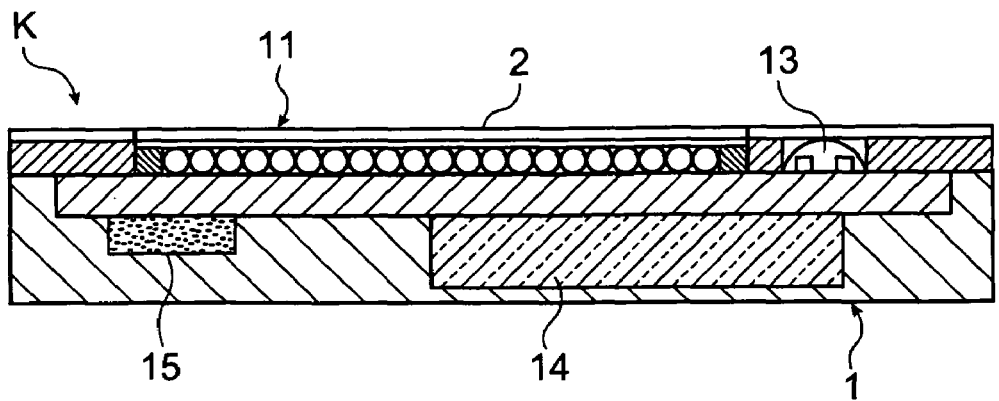
FIG. 7 is a sectional magnified drawing showing an IC card in Embodiment 2.
Figure 8:
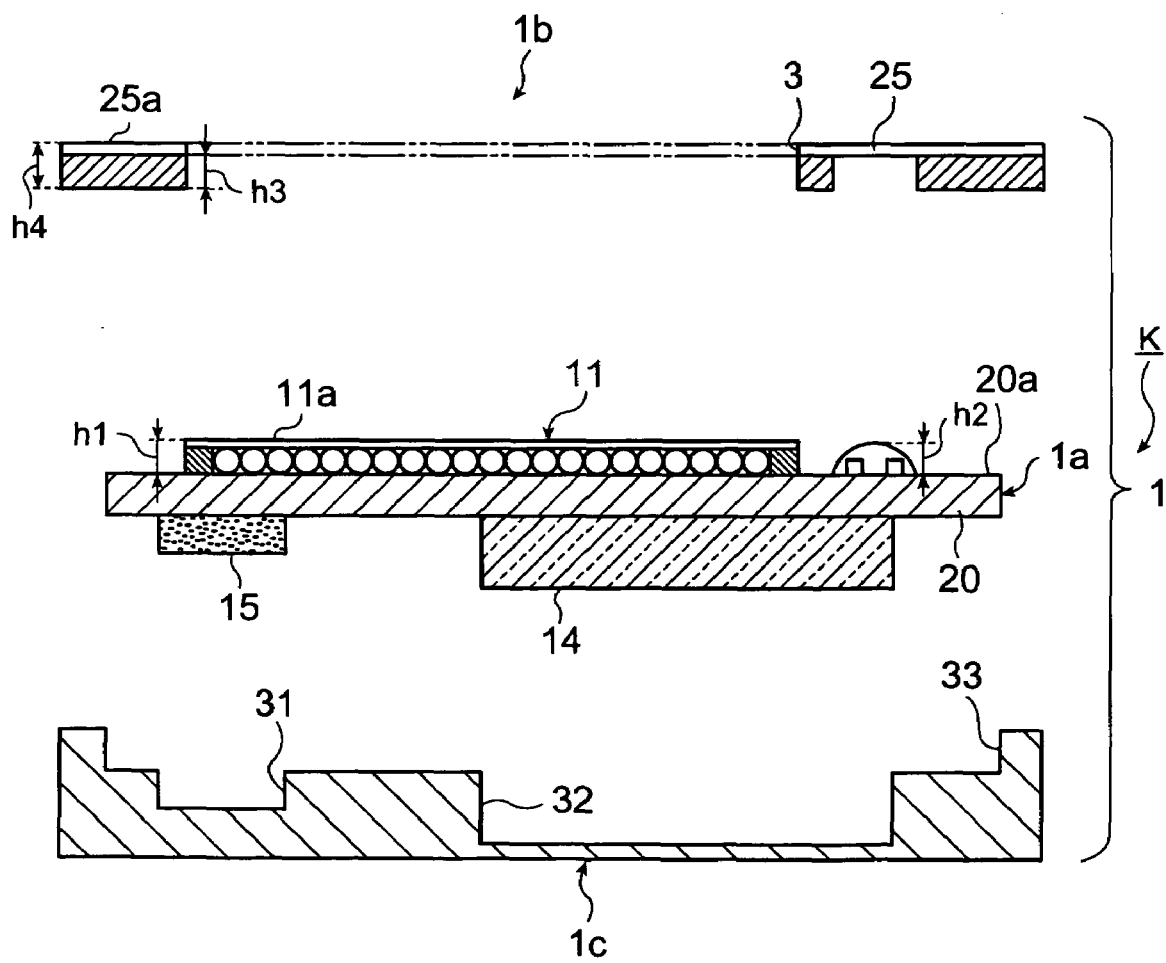
FIG. 8 is a deal drawing showing the IC card in Embodiment 2.

FIGS. 7 and 8 are sectional oblique drawings showing an IC card K in the embodiment. FIG. 7 is a drawing showing a section A-A' in FIG. 1, which is a sectional magnified drawing describing the sectional structure of the IC card K. FIG. 8 is a sectional magnified drawing of the IC card K, which is a deal drawing describing the structure of the IC card K in detail.

As shown in FIG. 8, the height h1 represents the distance between a top surface 20a of the FPC 20 and the uppermost part 11a of the EPD 11, and the height h2 represents the distance between the top surface 20a of the FPC 20 and an uppermost part 13a of the membrane switch 13. The relations between the heights h1 and h2 are h1>h2. In other words, the uppermost part 13a of the membrane switch 13 is located lower than the uppermost part 11a of the EPD 11.

In the front panel 1b, an opening 3 is formed at the cover portion 25. The opening 3 engages with the EPD 11 at the time when the inlet 1a and the front panel 1b are adhered together. Here, a height h4, which represents the sum of the heights for the junction 26 and the cover portion 25, has the same height as the height h2 of the EPD 11. Thus, when the EPD 11 is engaged with the opening 3, a top surface 25a of the cover portion 25 and the top surface 11a of the EPD 11 share the same height. On the contrary, at the membrane switch 13, the cover portion 25 is shielded. Furthermore, the height h2 of the membrane switch 13 is equal to or shorter than the height h3 of the junction 26, so that when the inlet 1a and the front panel 1b are adhered together, the membrane switch 13 is not pressed by the front panel 1b. In the card body 1 adhered and constructed this way, the uppermost part 13a of the membrane switch 13 is located more inwardly than the surface 2 of the card body 1.

In the embodiment, the EPD 11 is exposed at the opening 3. Similarly, the connecting IC terminal 12 and the fingerprint sensor 10 are also exposed at the opening 3. Consequently, the IC card K can conduct the information transmission with the external device via the connecting IC terminal 12. At the same time, the fingerprint sensor 10 can extract the fingerprint pattern of the user.

As mentioned above, in the IC card K in the embodiment, the cover portion 25 shields only the membrane switch 13, and the EPD 11 is exposed because of the opening 25. Hence the membrane switch 13 can be protected by the cover portion 25. Still further, since the cover portion 25 shields the membrane switch 13, it is possible to provide the membrane switch 13 more inwardly than the surface of the IC card K. Consequently, the EPD 11 is activated only in the case where the membrane switch 13 is pushed in locally in the direction of the card body 1's thickness. Further, the EPD 11 can be deactivated, if the pressure is applied to the membrane switch 13 in approximately the horizontal direction of, or at an angle with, the card body 1's surface. Consequently, the incorrect input to the membrane switch 13 can be prevented, except for the case where the EPD 11 is activated by the user's judgment; therefore the false operation of the IC card K can be prevented.

Since the EPD 11 is exposed at the opening, it can display images without the images being transmitted through the cover portion 25. If the images were to be transmitted through the cover portion 25, the display property of those images declines, due to the refractive index of the material of the cover portion 25, causing the images to be represented in a recessed manner. However, in Embodiment 2, the EPD 11 is exposed, thereby clear images with high contrasts can be displayed without being affected by the material's refractive index. Note that the EPD 11 employs a display method that conducts an image display by utilizing the light reflection; hence in order to improve the display property, it is desirable that the path length of the light transmitting the transparent material be short. Therefore, as is in the embodiment, with EPD 11 displaying the image without transmitting it through the cover portion 25, the image of the EPD 11 can be displayed clearly.

In the IC card K in the aforementioned embodiment, the uppermost part 13a of the membrane switch 13 is located more inwardly than the surface 2. However, the embodiment shall not be limited to such structure. The uppermost part of the membrane switch 13 and the surface 2 of the card body 1 may also be at the same level. Here, the input to the membrane switch 13 can also be conducted only in the case where the pressure is applied onto the membrane switch 13 in the direction of the card body 1's thickness. Moreover, the input into the membrane switch 13 is less facilitated in the case where the pressure is applied onto the membrane switch 13 in approximately the horizontal direction of, or at an angle with, the card body 1's surface, since the pressure is less likely to be brought on the direction of thickness. Therefore, the similar effect as in the above-mentioned embodiment can be obtained.

The present invention shall not be limited to the above-mentioned embodiments, and can obviously allow various modifications without departing from the main scope of the present invention.

What is claimed is:

1. An integrated circuit card comprising:
   a card body including a first component and a second component, the second component defining an outer surface of the card body and being operatively secured to the first component;
   an input means formed on a first surface of the first component of the card body; and
   a function part formed on the first surface of the first component of the card body, the function part operating corresponding to the input of the input means;
   wherein, in a direction of a thickness of the card body, an uppermost part of the input means is located at an approximately equal height as that of the outer surface of the card body, or is located more inwardly than the outer surface of the card body; and
   wherein the height from the first surface of the first component to an uppermost part of the input means is lower than the height from the first surface of the first component to an uppermost part of the function part.

2. The integrated circuit card according to claim 1, wherein the first and second component of the card body are adhered together.

3. The integrated circuit card according to claim 1, wherein the second component includes a cover portion that shields the input means and the function part.

4. The integrated circuit card according to claim 1, wherein the second component includes a cover portion that shields only the input means, and an opening that exposes the function part.

5. The integrated circuit card according to claim 1, wherein the card body further includes a third component arranged to face the second component; and
   wherein the first component is supported by the second component and the third component.

6. The integrated circuit card according to claim 1, wherein the function part serves as a display part that allows an image display.

7. The integrated circuit card according to claim 1, wherein the function part serves as an external connection terminal that allows a connection with an external device.

8. The integrated circuit card according to claim 1, wherein the function part serves as a fingerprint sensor that extracts fingerprint information.

\* \* \* \* \*